United States Patent [19]
Lee

[11] Patent Number: 5,279,669
[45] Date of Patent: Jan. 18, 1994

[54] PLASMA REACTOR FOR PROCESSING SUBSTRATES COMPRISING MEANS FOR INDUCING ELECTRON CYCLOTRON RESONANCE (ECR) AND ION CYCLOTRON RESONANCE (ICR) CONDITIONS

[75] Inventor: Young H. Lee, Somers, N.Y.

[73] Assignee: International Business Machines Corporation, Armonk, N.Y.

[21] Appl. No.: 806,504

[22] Filed: Dec. 13, 1991

[51] Int. Cl.$^5$ .............. C23C 16/00; H01L 21/00
[52] U.S. Cl. .................. 118/723 MR; 156/345;
315/111.41; 204/298.16; 204/298.37;
204/298.38; 118/723 I
[58] Field of Search .......... 118/723; 156/345;
315/111.21, 111.41; 204/298.38, 298.34, 298.37, 298.16

[56] References Cited

U.S. PATENT DOCUMENTS

| | | | |
|---|---|---|---|
| 4,401,054 | 8/1983 | Matsuo et al. | 118/723 |
| 4,438,368 | 3/1984 | Abe et al. | 204/298.37 |
| 4,492,620 | 1/1985 | Matsuo et al. | 204/298.05 X |
| 4,505,949 | 3/1985 | Jelks | 427/39 |
| 4,543,659 | 9/1985 | Sakudo et al. | 156/345 X |
| 4,559,100 | 12/1985 | Ninomiya et al. | 156/345 |
| 4,609,428 | 9/1986 | Fujimura | 156/646 |
| 4,624,214 | 11/1986 | Suzuki et al. | 204/298.34 |
| 4,683,838 | 8/1987 | Kimura et al. | 118/723 X |
| 4,691,662 | 9/1987 | Roppel et al. | 118/723 |
| 5,032,202 | 7/1991 | Tsai et al. | 204/298.38 |

FOREIGN PATENT DOCUMENTS

| | | |
|---|---|---|
| 55-53422 | 4/1980 | Japan . |
| 1-71130 | 3/1989 | Japan . |
| 1-103988 | 4/1989 | Japan . |
| 1-298174 | 12/1989 | Japan . |

OTHER PUBLICATIONS

K. Suzuki et al., "Radio-Frequency Biased Microwave Plasma Etching Technique...", J. Vac. Sci., Technol. B3, 1025 (1985).
R. W. Boswell et al., "Pulsed High Rate Plasma Etching with Variable Si/SiO$_2$ Selectivity and Variable Si Etch Profiles", Appl. Phys. Lett. 47, 1095 (1985).

Primary Examiner—Brian E. Hearn
Assistant Examiner—Jonathan D. Baskin
Attorney, Agent, or Firm—Robert M. Trepp

[57] ABSTRACT

A plasma reactor for forming a dense plasma from a gas is described incorporating a housing, a gas inlet to the housing, a pump for evacuating the housing, a magnetic coil to generate a magnetic field in the housing, a radio frequency power supply, an electrode or induction coil in the housing, a microwave power supply. The invention overcomes the problem of an upper plasma density limit independent of increases in microwave power by inducing electron cyclotron resonance (ECR) and ion cyclotron resonance (ICR) conditions.

20 Claims, 7 Drawing Sheets

PLASMA REACTOR FOR PROCESSING SUBSTRATES COMPRISING MEANS FOR INDUCING ELECTRON CYCLOTRON RESONANCE (ECR) AND ION CYCLOTRON RESONANCE (ICR) CONDITIONS

BACKGROUND OF THE INVENTION

1. Field of the Invention

This invention relates to plasma reactors for processing substrates and more particularly, to high density plasmas for etching substrates and for plasma enhanced chemical vapor deposition (CVD) on substrates.

2. Description of the Prior Art

A low temperature plasma (or process plasma) excited by radio frequency or microwave power has been widely used to fabricate microelectronic devices. A recent trend in silicon technology demands a single wafer process for both etching and thin film deposition in view of full automation of an ultra large scale integrated circuit fabrication line. In a single wafer process, the wafer throughput must be high in order to be economical. This means that a high radio frequency or microwave power source is needed to achieve a fast etch rate or deposition rate. High power operation, however, accompanies negative adverse effects such as radiation damage and particulate contamination to the substrate which becomes more and more of a critical issue as device dimensions continue to shrink in silicon technology.

In order to cope with the adverse effects of radiation damage and particulate contamination, Electron Cyclotron Resonance (ECR) of the microwave plasmas under a steady magnetic field have been applied for both etching and deposition. However, the ECR plasma density is not sufficient enough to take full advantage in utilizing a low pressure plasma below 1.0 mTorr. The normal operating pressure of plasmas generated by ECR is around a 10 mTorr range in order to achieve a reasonable wafer or substrate throughput.

In U.S. Pat. No. 4,683,838 which issued on Aug. 4, 1987, to Kimura et al., a plasma treatment system is disclosed for forming insulator films by making a stream of evaporated metal atoms generated from an evaporation source cross a stream of plasma containing highly activated oxygen atoms or nitrogen atoms at a high concentration. The plasma is formed in a discharge tube filled with a dilute gas by a microwave power source generated by a magnetron at 2.45 GHz which is led to the discharge tube. The discharge tube is surrounded by electromagnets whereby the charged particles in the plasma are put in a spiral motion so as to coil around the magnetic flux. The frequency of spiral motion is proportional to the mass of charged particles and the intensity of the external magnetic field. When the frequency of spiral motion becomes equal to that of the microwave, the charged particles will absorb the microwave to increase the kinetic energy. To make the electrons absorb the microwave, it is necessary to use an external magnetic field of 875 gauss. The electric discharge can be continuously and stably carried out even in a dilute gas atmosphere of below $10^{-5}$ Torr, and dissociation, excitation, ionization, etc of gas molecules can efficiently take place owing to a high kinetic energy level of electrons as compared with DC or RF discharge of 13.56 MHz.

In U.S. Pat. No. 4,691,662, which issued on Sep. 8, 1987, to Roppel et al., a dual plasma microwave apparatus is described wherein a first disk plasma is generated. A grid or screen having an electrical bias removes ions or electrons from the first disk plasma to a second location forming a hybrid plasma. The hybrid plasma is used to treat a surface of an article in a different manner than the first disk plasma.

In U.S. Pat. No. 4,492,620, which issued on Jan. 8, 1985, to Matsuo et al., a plasma deposition method and apparatus is described for depositing a thin film of various materials over the surface of a substrate. A plasma deposition apparatus is described comprising a plasma formation chamber into which a gas is introduced to produce a plasma; a specimen chamber in which a specimen substrate table is disposed for placing thereon a specimen substrate on which a thin film is to be formed and for depositing the thin film on the specimen substrate; a plasma extraction window interposed between the plasma formation chamber and the specimen chamber; the target which is made of a sputtering material and is interposed between the plasma extraction window and the specimen substrate table; a first means for extracting ions for sputtering the target from a plasma stream produced in the plasma formation chamber; and a second means for extracting the plasma stream from the plasma extraction window into the specimen chamber and for transporting the sputtered and ionized atoms to the specimen substrate placed on the specimen table.

In U.S. Pat. No. 4,609,428, which issued on Sep. 2, 1986, to Fujimura, a microwave plasma etching method and apparatus is described having an improved anisotropic etching capability and processing rate for etching and ashing integrated circuit semiconductor substrates. The gas pressure in the apparatus as described is selected to be low, approximately $10^{-3}$ to $10^{-4}$ Torr, so that the mean free path of the gas molecules substantially exceeds the dimensions of the apparatus.

In U.S. Pat. No. 4,559,100, which issued on Dec. 17, 1985, to Ninomiya et al., a microwave plasma etching apparatus is described which is suitable for rapid etching of Si, $SiO_2$, W, Al, etc. The microwave plasma etching apparatus comprises a discharge tube into which a discharge gas is supplied and which forms a discharge region; means for generating a magnetic field in the discharge region; means for bringing a microwave into the discharge region; and a stage for holding a material.

In U.S. Pat. No. 4,543,465, which issued on Sep. 24, 1985, to Sakudo et al., a microwave plasma source is described comprising a discharge space supplied with a microwave electric field and a DC magnetic field. A switch is provided for effecting through switching operation the change over of a magnetic field applied to the discharge space from the intensity for the ignition of plasma to the intensity for ion extraction in succession to completion of the plasma ignition.

In U.S. Pat. No. 4,401,054, which issued on Aug. 30, 1983, to Matsuo et al., a plasma deposition apparatus is described having a plasma formation chamber and a specimen chamber which are arranged separately. Gaseous material and microwave power are introduced to the plasma formation chamber to generate plasma by a microwave discharge through electron cyclotron resonance. The plasma is extracted to the specimen chamber from the plasma extracting orifice.

In a publication by K. Suzuki et al., entitled "Radio-Frequency Biased Microwave Plasma Etching Technique: A Method To Increase $SiO_2$ Etch Rate", J. Vac.

Sci. Technol. B3, 1025 (1985), a microwave plasma etching apparatus is shown with an RF voltage supply having an output coupled to the substrate. The RF voltage permits ions to be accelerated to the substrate even if insulators exist on the substrate surface. Further, ions can be accelerated to the substrate surface without retaining their charge, since ions and electrons are accelerated to the surface in turn.

In a publication by R. W. Boswell et al., entitled "Pulsed High Rate Plasma Etching With Variable Si/SiO$_2$ Selectivity And Variable Si Etch Profiles", Appl. Phys. Lett. 47, 1095 (1985), very high etch rates of Si in SF$_6$ have been obtained in low-pressure resonant RF discharge. The vacuum pump maintains the pressure in the interaction region of 7 mTorr.

SUMMARY OF THE INVENTION

In accordance with the present invention, a method and apparatus for forming a dense plasma from a gas at low pressure is described comprising a housing for holding a gas and a dense plasma to be formed from the gas, a duct and valve for emitting one or more gas species into the housing to comprise the gas, a pump for evacuating the housing to a predetermined low pressure, for example 1 mTorr, a coil for generating a substantially constant magnetic field along a first axis in a first region within the housing, a radio frequency power supply and an electrode for applying first radio frequency power along a second axis to the gas to form the dense plasma in the first region, and a microwave power supply and a waveguide for applying microwave power along a third axis to the gas to form the dense plasma in the first region whereby electrons are excited to Electron Cyclotron Resonance (ECR), the radio frequency power supply includes means for determining the frequency of the radio frequency power as a function of the magnetic field and one of the gas species whereby Ion Cyclotron Resonance is obtained of the ions of the gas species in the plasma.

It is an object of the invention to obtain a highly dense plasma beyond the limitation of exciting electrons to Electron Cyclotron Resonance.

It is a further object of the invention to provide low pressure operation of the plasma reactor to provide neutral plasma species and energetic ion species in a controlled fashion, which enables various plasma process tools ranging from plasma etching, plasma deposition, thin film planarization, ion milling, and downstream plasma ashing.

It is a further object of the invention to provide an extraction grid and a pulse generator for extracting pulses of ions from the plasma.

It is a further object of the invention to provide an extraction grid with holes therein having a predetermined orientation, length and width to provide ions passing there through with a velocity within a predetermined angular variation with respect to the orientation of the holes.

DESCRIPTION OF THE PREFERRED EMBODIMENT

Figure 1:
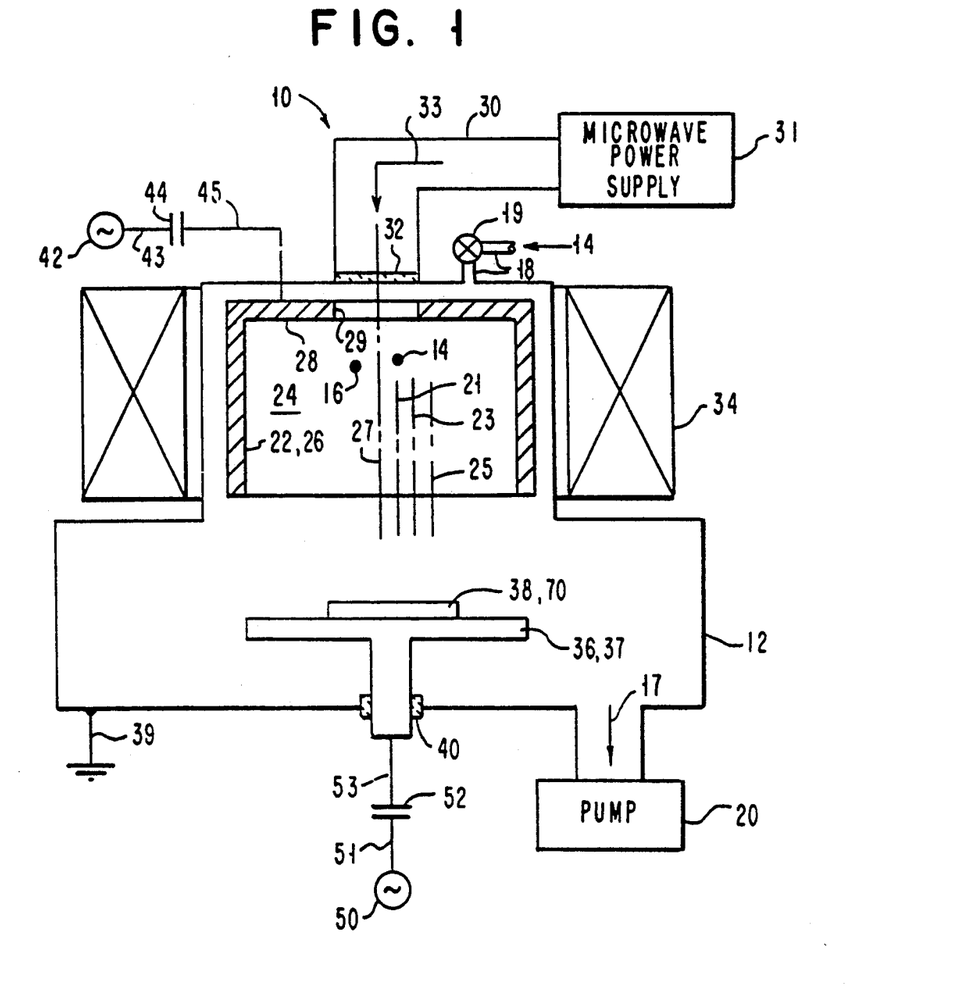
FIG. 1 is one embodiment of the invention.

Referring now to the drawing, FIG. 1 shows an embodiment of a plasma reactor 10. Plasma reaction 10 functions to form a dense plasma from a gas at low pressure useful for etching substrates and for plasma enhanced chemical vapor deposition (CVD) of materials on substrates. A housing 12 for containing a gas 14 and a dense plasma 16 is shown in FIG. 1. A duct 18 and valve 19 provide a means for admitting one or more gas species into the housing to form gas 14 in housing 12. Gas 14 may be, for example, argon. Housing 12 is evacuated to a predetermined low pressure by means of pump 20. Arrow 17 shows the flow of gas 14 and plasma 16 into pump 20. Pump 20 may be a turbo-molecular pump. A hollow cathode 22 is positioned in housing 12 for defining a first region 24 in the hollow-space of hollow cathode 22 within housing 12 for generating dense plasma 16. Hollow cathode 22 may have cylindrical sidewalls 26 concentric with axis 27 and surrounding first region 24. Hollow cathode 22 may have a conductive end piece 28 coupled to sidewalls 26 with the other end of sidewalls 26 remaining open. End piece 28 may have a window or opening 29 to receive microwave power by way of waveguide 30 and microwave window 32 from microwave power source 31 shown by arrow 33. Magnetic coil 34 is adapted for being coupled to a direct current power source. Magnet coil 34 function to generate a substantially constant magnetic field in first region 24 within housing 12. The direction of the magnetic field is in the direction of axis 21. As shown in FIG. 1 magnetic coil 34 is positioned external to housing 12. Magnetic coil 34 may also be positioned within housing 12. Magnet coil 34 may generate a magnetic field in the range from 1170 to 1430 gauss. Magnetic coil 34 may produce a magnetic field of 1300 G at microwave window 32, gradually decreasing to 875 G at the resonant point (B$_r$) in first region 24 with a variation of the magnetic field strength of less than or equal to 10% in first region 24 orthogonal to axis 21. First region 24 between sidewalls 26 of cathode 22 may have a diameter of 25.4 centimeters (10 inches). The magnetic field may decrease in the direction along axis 21 towards opening 29 and after first region 24 decrease in the direction along axis 21 towards substrate 38.

Spaced apart from hollow cathode 22 and along axis 27 is substrate electrode 36 having a surface 37 transverse to axis 27 for supporting substrate 38. As shown in FIG. 1, housing 12 is grounded by way of conductor 39. Hollow cathode 22 and substrate electrode 36 are electrically floating and electrically isolated from ground potential. Substrate electrode 36 is supported and sealed with respect to housing 12 by annular bushing 40 which is made of insulating material to permit electrode 36 to feed through housing 12.

RF power supply 42 is coupled over lead 43 through capacitor 44 and over lead 45 through housing 12 to hollow cathode 22. RF power supply 42 may generate a signal having a frequency in the range from 0.1 to 100 MHz with a power, for example, of 400 watts (0.5 w/cm³) along axis 23. Sidewalls 26 of hollow cathode 22 are protected by a material which can prevent a cross contamination to plasma 16 and also can supply a species of gas needed for thin film deposition on substrate 38. Thus, the arrangement shown in FIG. 1 is ideal for depositing material on substrate 38.

RF power to supply 42 functions to supply radio frequency (RF) power in the direction of axis 23 to plasma 16, and more specifically, to particular ions in plasma 16 in first region 24. Microwave power supply 31, which may have a frequency of, for example, 2.45 GHz may supply microwave power through waveguide 30, window 32 and opening 29 to plasma 16 in first region 24. Microwave power supply 31, may supply, for example, 1000 watts (1.25 w/cm³) of microwave power along axis 25 to first region 24. While the magnetic field in the first region may be 875 G, substrate electrode 36 is spaced far enough away to have a diminished, or greatly reduced, magnetic field of, for example, 50 G. The plasma is excited for the most part in first region 24.

Axes 21, 23, 25 and 27 may be collinear to one another or axes 21, 22, 23 and 27 may have their own respective orientation transverse to one another.

A highly dense plasma 16 may easily heat and cause damage to substrate 38, especially highly conducting materials like silicon and GaAs device quality substrates, when the substrate is in close contact or in close proximity to dense plasma 16. Thus, it is highly desirable to physically isolate, or space apart, substrate 38 from dense plasma 16.

The conventional method of ion extraction using an ion extraction grid cannot be used due to the contamination problem through sputtering the material off the extraction grid, particularly, with reactive gas plasmas. The contamination problem will cause adverse effects to semiconductor devices on substrate 38. FIG. 1 shows an RF bias supply 50 for providing low power over lead 51 through isolating capacitor 52 over lead 53 to substrate electrode 36. The RF bias supply voltage that is coupled to substrate electrode 36 causes positive ions from plasma 16 in first region 24 to be pulled towards substrate 38. Since substrate 38 only sees a low RF power or voltage from RF bias supply 50, most of the electrons in plasma 16 are confined within plasma 16 preventing an excessive electron charge accumulation on substrate 38.

Since plasma 16 and substrate 38 are physically separated and linked independently by RF bias supply 50 or by a DC electric field, plasma reactor 10, as shown in FIG. 1, has an advantage over conventional plasma reactors in controlling the direction and flux of the ion current from plasma 16 as an independent process parameter. The operation at low pressure, for example, is in the range from 0.1 to 10 mTorr. Plasma reactor 10 is unique in combining neutral plasma species and energetic ion species in a controlled fashion, which enables the user of the invention to develop various plasma process tools ranging from plasma etching, plasma deposition, thin film planarization, ion milling and downstream plasma ashing.

Electron cyclotron resonance (ECR) occurs when the electron path is in a circular orbit due to a magnetic field and completes a number of revolutions per second corresponding to applied microwave power at frequency ν given by equation 1:

$$2\pi\nu = \frac{eB}{m} \quad (1)$$

where ν is the microwave frequency of the applied microwave power, e is the electron charge, B is the magnetic field and m is the mass of the electron.

If the magnetic field B is greater than $B_R$ then the microwave power is transparent to the electrons in the plasma where $B_R$ is the magnetic field at resonance of the orbiting electron. If the magnetic field B is less than $B_R$ then the microwave power is opaque to the electrons in the plasma. Typical chemical reactions in an ECR plasma containing argon is given by equations 2 and 3:

$$Ar \rightarrow Ar^+ + e^- \quad (2)$$

$$Ar + e^- \rightarrow Ar^+ + 2e^- \quad (3)$$

A typical chemical reaction in an ECR plasma containing carbon tetrafluoride is given in equation (4):

$$CF_4^+ + e^- \rightarrow CF_3^+ + F + 2e^- \quad (4)$$

The ion cyclotron resonance (ICR) for an ion is given by equation 5:

$$2\pi\nu = \frac{IB}{M} \quad (5)$$

where ν is the radio frequency of the applied frequency, I is the ion charge, B is the magnetic field and M is the mass of the ion.

Figure 2:
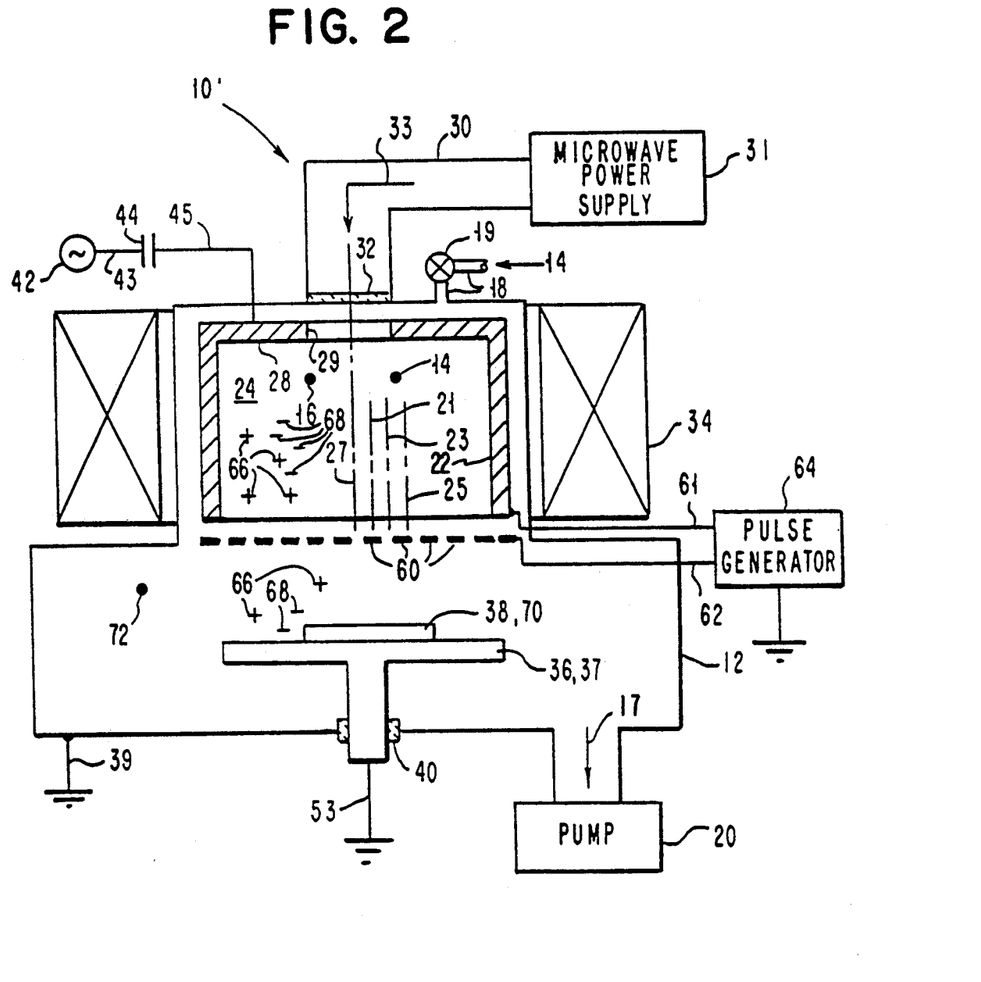
FIG. 2 is a first alternative embodiment of the invention.

Referring to FIG. 2 a plasma reaction 10' having an extraction grid 60 is shown. In FIG. 2 like numerals are used for functions corresponding to the apparatus of FIG. 1. Extraction grid 60 may consist, for example, of a plurality of wires or rods coupled in common over lead 62 to the output of pulse generator 64. Pulse generator 64 may also be coupled to hollow cathode 22 by way of lead 61. Extraction grid 60 may alternatively be a perforated conducting plate. Extraction grid 60 is positioned between plasma 16 and more particularly hollow cathode 22 and substrate 38. Substrate 38 is positioned on substrate electrode 36. As shown in FIG. 2, substrate electrode 36 is coupled over lead 53 to ground potential.

If extraction grid 60 is negatively biased with respect to the plasma potential of plasma 16 and/or hollow cathode 22, positively charged ions 66 are accelerated toward extraction grid 60 and those ions 66 passing through extraction grid 60 reach substrate electrode 36 and wafer 38. If extraction grid 60 is positively biased with respect to the plasma potential of plasma 16 and/or hollow cathode 22, negatively charged ions 68 can selectively reach substrate electrode 36 and substrate 38. If the bias voltage, with respect to the plasma potential of plasma 16 and extraction grid 60, is changing with time between a negative potential which extracts positively charged ions 68 and a positive potential which repels positively charged ions 68, substrate electrode 36 and substrate 38 will receive a pulsed ion beam of positively charged ions 68 irradiating or impinging on surface 70 of substrate 38. Neutral radicals in plasma 16 and in the atmosphere 72 within housing 12 should not be effected by the biased voltage on extraction grid 60.

The plasma potential of plasma 16 is normally very low, for example, below 50 volts. The plasma potential of plasma 16 can be varied by varying the output power of RF power supply 42 which is applied to hollow cathode 22. The pressure within housing 12 of plasma 16, gas 14 and atmosphere 72 is typically in the range from 0.1 to 10 mTorr.

The selection of the species of positively charged ions 66 or the species of negatively charged ions 68 by the use of extraction grid 60 in FIG. 2 may be a technically difficult problem. For example, if the biased voltage on extraction grid 60 is too high, for example, above 500 volts, a typical extraction voltage of an ion source, extraction grid 60 may generate plasmas by itself due to a moderately high operating pressure in the range from 1 to 10 mTorr. If the extraction grid voltage is lower than the plasma potential of plasma 16 and/or hollow cathode 22, extraction grid 60 can not block the ion beam or ions from plasma 16 effectively. Therefore, for best operation, the biased voltage on extraction grid 60 must be low enough to suppress a plasma formation on the one hand, but high enough to block ions from plasma 16 on the other. For example, the voltage on extraction grid 60 may be in the range from 10 to 100 volts.

Figure 3:
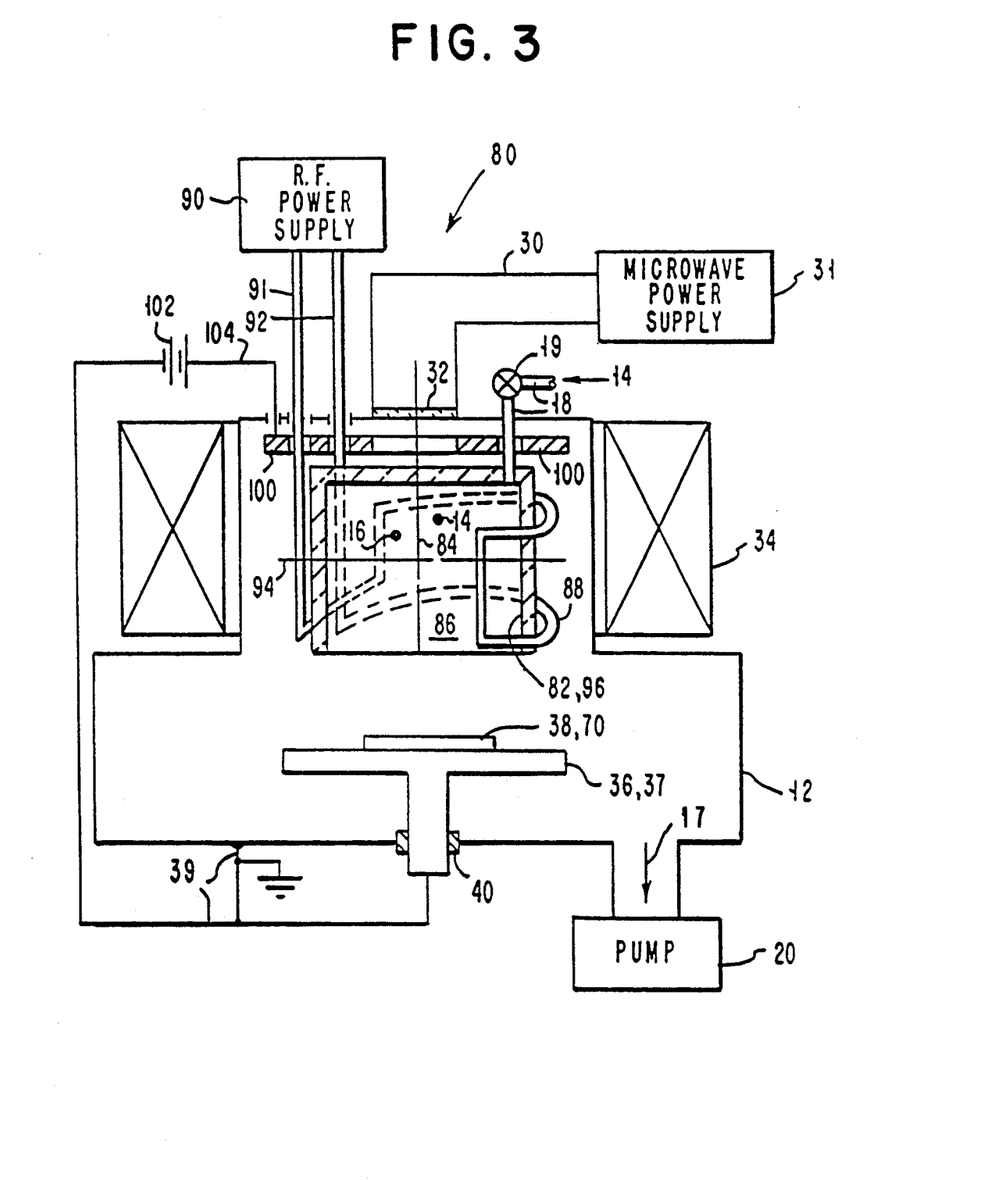
FIG. 3 is second alternative embodiment of the invention.

Referring to FIG. 3, a plasma reactor 80 is shown. In FIG. 3 like references are used for functions corresponding to the apparatus of FIG. 1. In FIG. 3, a quartz chamber 82 is shown in place of hollow cathode 22 shown in FIG. 1 to contain plasma 16 and gas 14. Gas 14 is supplied to quartz chamber 82 by way of duct 18. Quartz chamber 82 may be formed from other materials such as ceramic material and glass. Microwave power from microwave power supply 31 is coupled by way of waveguide 30 through window 32 of waveguide 30 into quartz chamber 82 along axis 84. Magnet coil 34 functions to provide a magnetic field along axis 84. The volume within quartz chamber 82 for generating plasma 16 is first region 86. A coil or induction coil 88 is shown partially wrapped around the exterior of quartz chamber 82 and functions to provide a.c. magnetic field transverse, perpendicular or substantially normal to axis 84. Radio frequency power supply 90 functions to provide radio frequency power over leads 91 and 92 to induction coil 88. Coil or induction coil 88 has a predetermined inductance to provide a predetermined inductive reactance at the frequency of the radio frequency power. Induction coil 88 may generate an alternating magnetic field along axis 94 which is orthogonal to axis 84 in first region 86. The radio frequency power in induction coil 88 drives plasma 16 to the ion cyclotron resonant state or double resonance, plasma (ion and electron resonances) to increase the efficient use of radio frequency power in the magnetic field in plasma 16. Plasma 16 is therefore excited through double resonances of the radio frequency power for ions and the microwave power for electrons. The double resonances of radio frequency and microwave power can easily improve the ionization efficiency by two or three orders of magnitude higher than what electron cyclotron resonance alone can provide. Thus, the double resonances of radio frequency and microwave power can operate at a pressure of plasma 16 and gas 14 of the molecular flow regime in a range from 0.1 to 10 mTorr. Also, one can achieve a faster etch rate acceptable for a single wafer plasma etcher as shown in FIG. 3. The double resonance of radio frequency and microwave power is idealized or preferred in an etching system, for example, as shown in FIG. 3, because it will minimize sputtering at the inner wall 96 of quartz chamber 88 by using induction coil 88. Extraction of ions from plasma 16 is facilitated by bias plate 100 which is positioned above plasma 16 so that plasma 16 is between bias plate 100 and substrate electrode 36. A bias voltage from battery or voltage source 102 is coupled over lead 104 to bias plate 100. The other side of voltage source 102 is coupled over lead 39 to ground potential and to substrate electrode 36. As shown in FIG. 3, a positive voltage is applied to bias plate 100. The electrostatic field formed between bias plate 100 and substrate electrode 36 functions to push out positive ions from plasma 16 and pulls negative ions and electrons away from substrate electrode 36.

Figure 4:
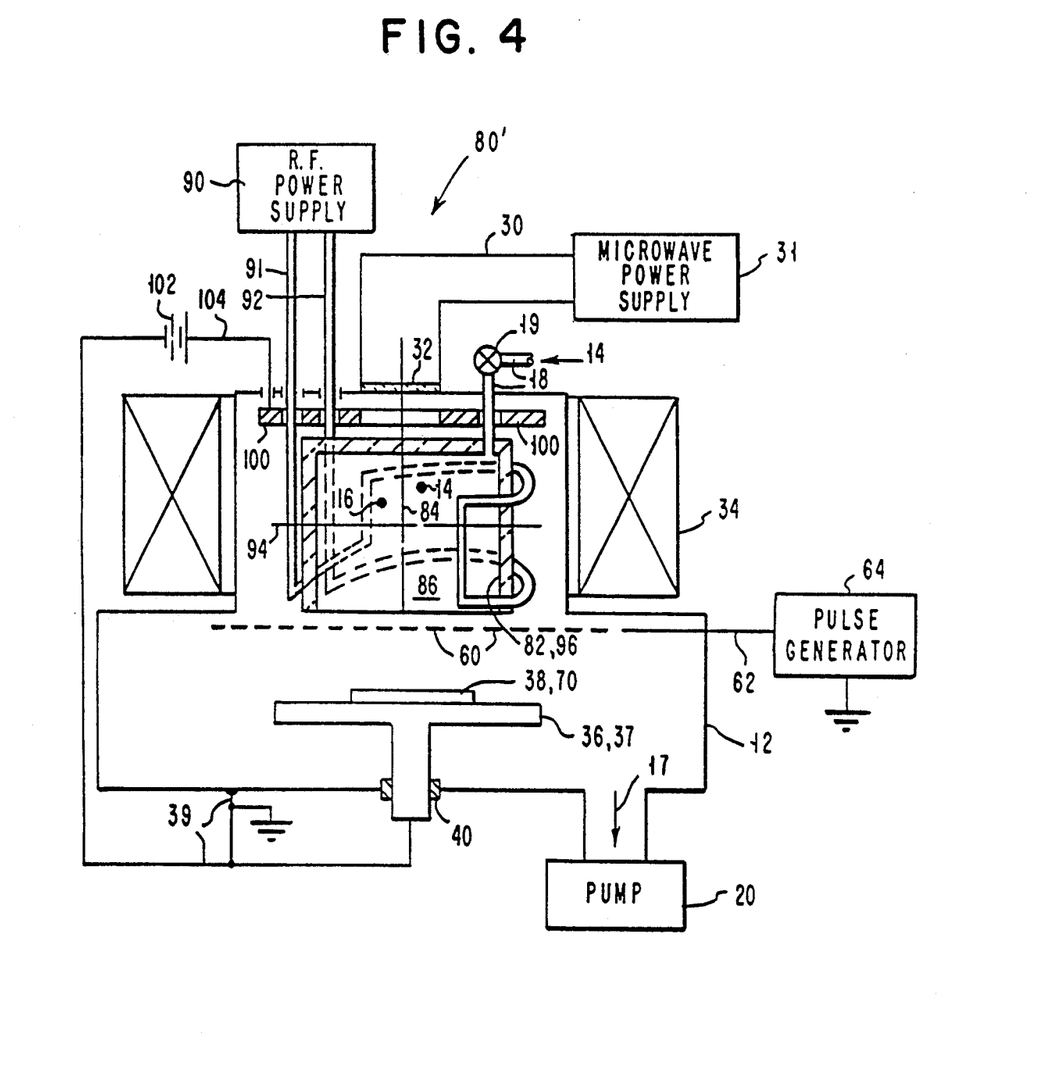
FIG. 4 is third alternative embodiment of the invention.

Referring to FIG. 4, plasma reaction 80' is shown. In FIG. 4, like reference numerals are used for functions corresponding to the apparatus of FIGS. 1-3. Extraction grid 60 functions to extract ions from plasma 16 in response to pulses of predetermined voltage from pulse generator 64.

In operation of plasma reactor 10 shown in FIG. 1, the radio frequency power supply 42 was operated at 100 KHz, microwave power supply 31 was operated at 2.45 GHz, and RF bias supply 50 was operated at 13.56 MHz. However, both hollow cathode 22 and substrate electrode 36 may be powered at other frequencies as well. Characterization of plasma 16 was performed by Langmuire probe, optical emissions, self-bias voltages and Faraday cup for ion currents. Plasma reactor 10 was operated with gas 14 being argon and plasma 16 being an argon plasma. Optical emission from the argon plasma exhibits a blue columnar plasma along axis 27, which qualitatively demonstrates a large population of $Ar^+$ Ions. The ion saturation current to substrate electrode 36 with hollow cathode 22 electrically floating and with no radio frequency power from radio frequency power supply 42 and 50 was measured at 500 microamps. Under the same plasma conditions, in plasma reactor 10, with hollow electrode 22 grounded, an ion saturation current at substrate electrode 36 was measured at 150 microamps indicating that plasma reactor 10 with a floating hollow electrode 22 improves plasma excitation rates by a factor of 3 to 4.

Figure 5:
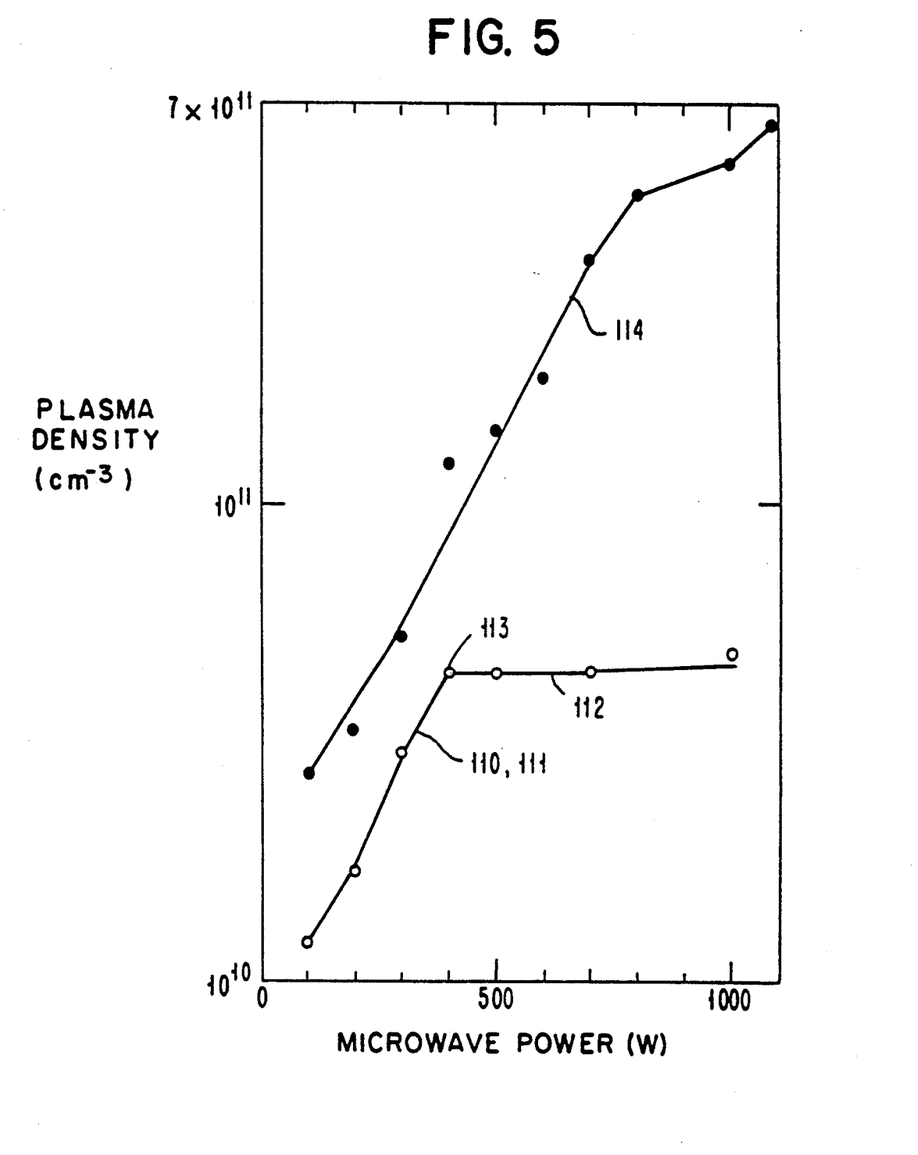
FIG. 5 is a graph of the plasma density versus microwave power.

The plasma density of plasma 16 in plasma reactor 10 was measured by Langmuire probe located at 8 cm above surface 37 of substrate electrode 36 and about 20 cm below the resonant point (870 G) of plasma reactor 10 in region 24. The measurements obtained with a Langmuire probe at 8 cm above surface 37 are shown in FIG. 5 by curves 110 and 114. In FIG. 5 the ordinant represents plasma density ($cm^{-1}$) and the abscissa represents microwave power (W). For the data in curves 110 and 114, the pressure in housing 12 was 1 mTorr, the gas 14 was argon and the flow rate was 20 standard cubit cm (sccm).

Curve 110 in FIG. 5 represents data taken with a conventional ECR reactor of which the inner walls were electrically grounded. Since the grounded sidewall attracts electrons, the plasma density tens to saturate at a fairly low microwave power. As shown by curve 110 and curve 111, plasma density increases with microwave power up to point 113 on curve 110. Thereafter, curve portion 112 or curve 110 is relatively flat indicating a constant plasma density independent of increases in microwave power. Point 113 occurs at 400 watts of microwave power in this particular ECR reactor. The fact that further increase in microwave power does not affect the plasma density beyond point 113 on curve 110, results in an upper plasma density value which is a draw back of the ECR reactor source, when one wants to shorten process time. In plasma reactor 10 shown in FIG. 1, hollow cathode 22 is allowed electrically to float above ground potential, thereby keeping electrons confined within plasma 16.

Curve 114 in FIG. 5 represents measurements taken in plasma reactor 10 obtained with a Langmuire probe at 8 cm above surface 37 and clearly demonstrates that the plasma density continuously increases with an increase in microwave power. At 1000 watts, which is the normal operating point, the ion density improved by 10 times the plasma density shown by curve 110. Since the plasma density at the resonant point is about an order of magnitude higher than the plasma density 16 at hollow cathode 22, the density of $5 \times 10^{11}$ /cm$^3$ at 1000 watts can be translated into roughly $5 \times 10^{12}$/ cm$^3$ at the resonant point inside an ECR plasma reactor. Taking the operating pressure within housing 12 of 1 mTorr into account, the ionization efficiency of plasma reactor 10 shown in FIG. 1 must be about 14%. Note that the ionization efficiency is normally 1% in an ECR plasma reactor and less than 0.1% in a magnetron or radio-frequency plasma. Therefore, plasma reactor 10 shown in FIG. 1 is a big improvement over a straight ECR plasma reactor with grounded sidewalls even without applying RF power to hollow cathode 22.

At times when RF power supply 42 operating at 100 KHz applied power to hollow cathode 22, a further increase in the ion density in plasma 16 was measured and observed. For example, at a pressure of 2.5 mTorr in housing 12 and with microwave power supply 31 supplying 300 watts, the density of plasma 16 was measured to be $1.6 \times 10^{11}$ / cm$^3$ at first times with zero power supplied to hollow cathode 22 and 2.2 times $10^{11}$ / cm$^3$ at second times with 400 watts applied to hollow cathode 22 by RF power supply 42. The density of plasma 16 improved by 37% with the application of 400 watts at 100 KHz to hollow cathode 22. In addition, actual ion currents were measure by a Faraday cup to be 0.2 mA/cm$^2$ with RF bias only (magnetron plasma); 0.37 mA/cm$^2$ with 400 watts of RF power from RF power supply 42 at hollow cathode 22 and 11.3 mA/cm$^2$ with 400 watts from RF power supply 42 at 100 KHz and 400 watts from microwave power supply 31 operating at 2.45 GHz. Thus, the ion current density of plasma reactor 10 is about 50 times higher than magnetron plasma and about 4 times higher than a straight ECR plasma reactor. Although a 100 KHz power supply was used to provide power to hollow cathode 22, a radio frequency of 13.5 MHz or harmonics thereof would be expected to be more efficient to generate ions.

The self-induced RF bias voltage from RF bias supply 50 at substrate electrode 36 may be reversed from the negative polarity of potential to the positive polarity of potential. The self-bias voltage in the past in ECR plasma reactors was always negative.

Figure 6:
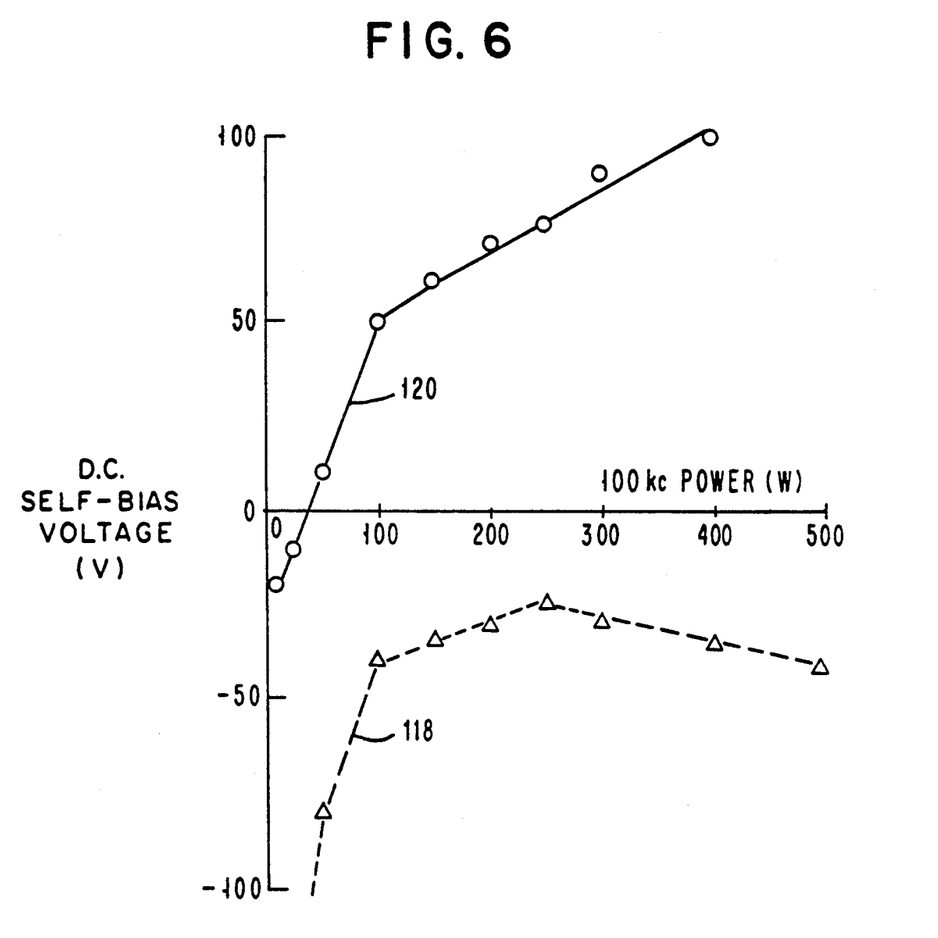
FIG. 6 is a graph of the DC self-bias voltage versus radio frequency power.

FIG. 6 shows the d.c. self-bias voltages of substrate electrode 36 shown in FIG. 1 with respect to 100 KHz power supplied from RF power supply 42 and hollow cathode 22, while keeping all other parameters constant. The pressure within housing 12 was maintained at 5 mTorr and RF bias power from RF bias supply 50 was 100 watts at 13.5 MHz. Gas 14 was argon flowing through valve 19 at 20 sccm. Curve 118 in FIG. 6 shows the DC self-bias voltage as a function of 100 KHz power from RF power supply 42 with no microwave power applied to plasma 16 from microwave power supply 31. Curve 120 shows the d.c. self-bias voltage as a function of 100 KHz power from RF power supply 42 and with 400 watts of microwave power applied to plasma 16 from microwave power supply 31. In FIG. 6 the ordinate represents d.c. self-bias voltage (V) and the abscissa represents 100 KHz power (W) coupled over lead 45 to hollow cathode 22. As shown by curve 118, the d.c. self-bias voltage was always negative when no power was supplied by microwave power supply 31. With microwave power supply 31 applying 400 watts to plasma 16, the d.c. self-bias voltage as shown by curve 120 was continuously shifted toward the positive potential, as hollow cathode 22 received power increases over lead 45. Langmuire probe measurements showed that in plasma reactor 10 shown in FIG. 1, the potential of plasma 16 increases proportionally to the RF power applied to hollow cathode 22 over lead 45. The net voltage difference across the ion sheath or plasma 16 at substrate electrode 36 stays very low as in the case of conventional ECR plasma reactors.

Figure 7:
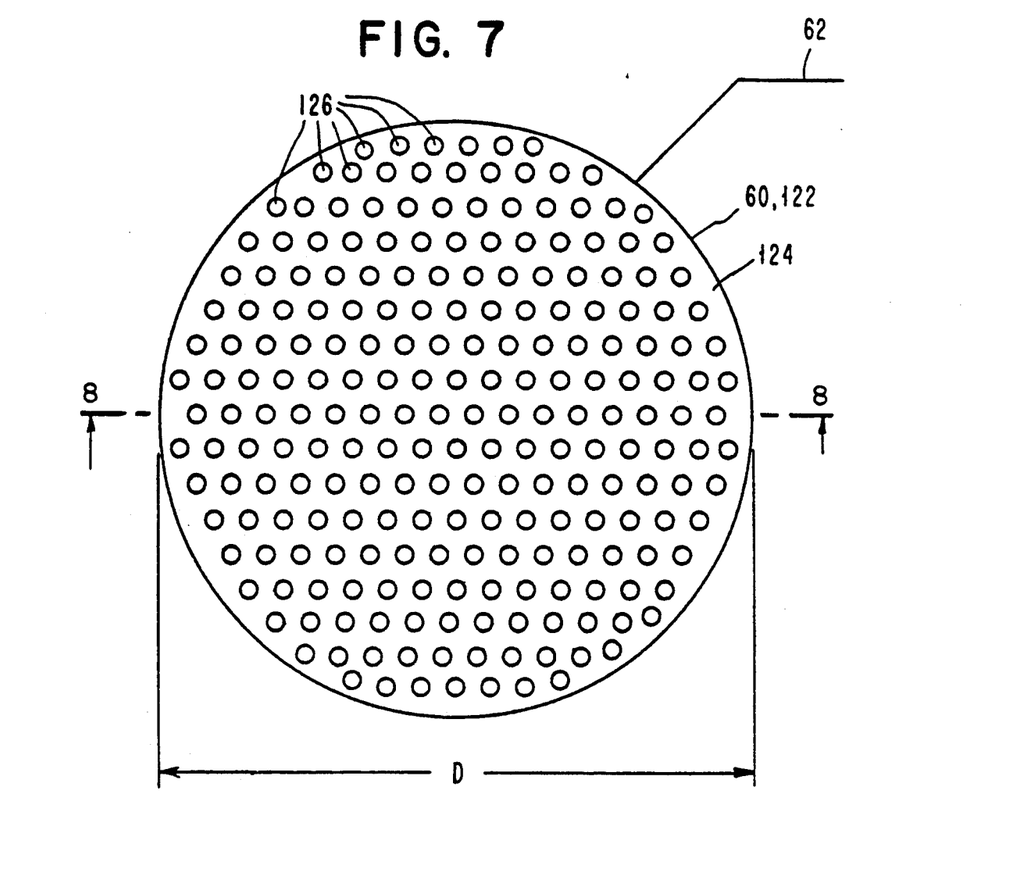
FIG. 7 is a top view of a portion of one embodiment of extraction grid 60 in FIG. 2 viewed from first region 24.
Figure 8:
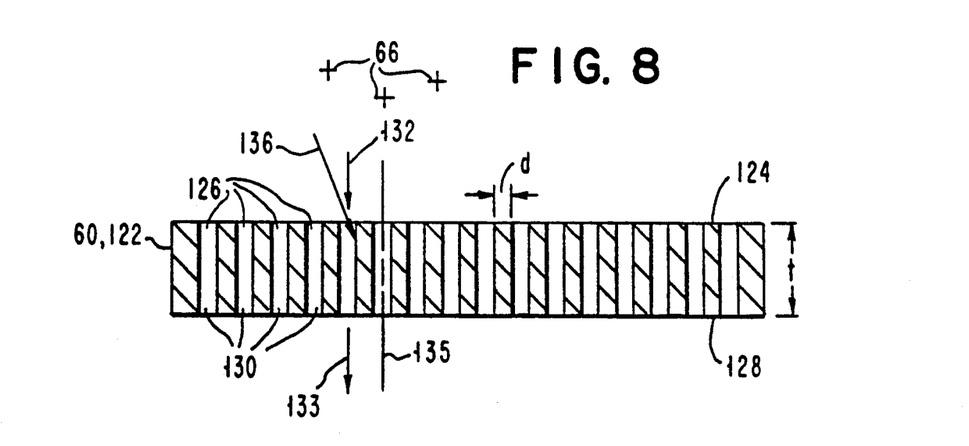
FIG. 8 is a cross-section view along the lines 8—8 of FIG. 7.

FIG. 7 is a top view of a portion of one embodiment of extraction grid 60 in FIG. 2 as viewed from a first region 24 in FIG. 2. Extraction grid 60, as shown in FIG. 7, may have a diameter D and a thickness t shown in FIG. 8. FIG. 8 is a cross-section view along the lines 8—8 of FIG. 7. Extraction grid 60 may be a plate 122 and is made of conductive material, for example, metal such as stainless steel or aluminum. Extraction grid 60 or plate 122 has holes 126 which may be, for example, cylindrical having a diameter d passing from upper surface 124 to lower surface 128 shown in FIG. 8. Extraction grid 60 or plate 122 may have a thickness in the range from 0.10 to 0.50 centimeters. Holes 126 may have a diameter d in the range from 0.051 centimeters or ⅓ of the thickness t to 1000 Å. The holes are oriented transverse or orthogonal to upper surface 124. As shown in FIG. 8, the holes are oriented orthogonal. Holes 126 function to neutralize ions 66 at times when ions 66 impinge on sidewalls 130 of holes 126. Positive ions 66 are attracted to extraction grid 60 at times when a negative bias is applied over lead 62 with respect to hollow cathode 22 having a d.c. bias applied by way of lead 61. As shown in FIG. 8, arrows 132 and 133 show the path of positive ions 66 through holes 126 without touching or impinging sidewalls 130. Arrow 136 shows the path of a positive ion 66 that impinges sidewall 130. Neutralized ions will not react with the surface 70 of substrate 78 as readily as positive ions 66. The positive ions 66 passing through holes 126 will having a velocity in a limited angular orientation and will, therefore, impinge on the surface 70 of substrate 38 shown in FIGS. 2 and 4 from a predetermined direction within a small angular variation with respect to longitudinal axis 135. Longitudinal axis 135 is shown in FIG. 8 for a typical hole 126 and is orthogonal to upper surface 124 and lower surface 128 of extraction grid 60. The maximum line of sight angle through hole 126 with respect to longitudinal axis 135 is equal to the tangent of d/t.

A plasma reactor has been described to generate a highly dense plasma for microelectronic application. The plasma reaction can be used for various plasma processes, such as plasma etching, plasma deposition, thin film planarization, ion milling and down-stream plasma asher.

Having thus described my invention, what I claim as new and desire to secure by Letters Patents is:

1. An apparatus for forming a dense plasma from a gas at low pressure comprising:
   a housing for holding said gas and said dense plasma to be formed,
   first means for admitting one or more gas species into said housing to form said gas,
   second means for evacuating said housing to a predetermined low pressure,
   third means for generating a magnetic field along a first axis in a first region within said housing,
   fourth means for applying first radio frequency along a second axis to said gas and dense plasma in said first region, and
   fifth means for applying microwave power along a third axis to said gas and dense plasma in said first region, whereby electrons are excited to electron cyclotron resonance (ECR) in said first region,
   said fourth means includes sixth means for determining the frequency of said first radio frequency power as a function of the magnetic field and one of said gas species whereby ion cyclotron resonance (ICR) is obtained of said ions of said gas specie in said plasma.

2. The apparatus of claim 1 wherein said fourth means includes a first electrode of nonmagnetic material positioned in said first region, and
   a second electrode of nonmagnetic material positioned in gaseous communication with said first region.

3. The apparatus of claim 2 wherein said first and second electrodes are coupled across said fourth means for applying said first radio frequency power.

4. The apparatus of claim 2 wherein said first electrode has inner sidewall surfaces of predetermined material whereby said material on said inner sidewall surfaces may be used for deposition on a substrate.

5. The apparatus of claim 4 wherein said substrate is positioned between said first and second electrode.

6. The apparatus of claim 2 further including seventh means for applying second radio frequency power to said second electrode.

7. The apparatus of claim 2 wherein said first electrode includes cylindrical inner sidewalls concentric with said first axis.

8. The apparatus of claim 2 wherein said second electrode is positioned outside said first region.

9. The apparatus of claim 1 wherein said second means includes seventh means for evacuating said housing below 1 m Torr.

10. The apparatus of claim 1 wherein said third means includes seventh means for generating said magnetic field in the range from 1170 to 1430 gauss.

11. The apparatus of claim 1 wherein said fourth means includes seventh means for applying said first radio frequency power at a frequency in the range from 0.1 to 100 MHz.

12. The apparatus of claim 1 wherein said fourth means includes seventh means for applying said first radio frequency power in the range from 10 to 500 watts.

13. The apparatus of claim 1 wherein said fourth means includes seventh means for applying said first radio frequency power to said plasma in the range from $0.01$ w/cm$^3$ to $0.63$ w/cm$^3$.

14. The apparatus of claim 1 further including an extraction grid positioned adjacent said first region adapted for coupling to a voltage for removing ions from said first region in response to said voltage.

15. The apparatus of claim 14 wherein said extraction grid includes a conductive plate having an upper and lower surface and having holes therein for passing ions there through.

16. The apparatus of claim 15 wherein said holes in said conductive plate have a longitudinal axis passing through said plate at a predetermined angle with respect to said upper surface.

17. The apparatus of claim 16 wherein said holes are cylindrical having a diameter in the range from 1000 Å to 0.051 cm (0.020 inch).

18. The apparatus of claim 16 wherein said plate has a thickness in the range from 0.1 cm (0.04 inch) to 0.5 cm (0.2 inch).

19. The apparatus of claim 1 wherein said fourth means includes an induction coil positioned around said first region.

20. The apparatus of claim 19 further including an extraction grid positioned adjacent said first region adapted for coupling to a voltage for removing ions from said first region in response to said voltage.

* * * * *